(12) United States Patent
Storn

(10) Patent No.: US 9,129,759 B2
(45) Date of Patent: Sep. 8, 2015

(54) CIRCUIT FOR DETECTING THE POSITIONS OF CONTACTORS IN A TURBINE ENGINE

(75) Inventor: Maxime Storn, Melun (FR)

(73) Assignee: SNECMA, Paris (FR)

( * ) Notice: Subject to any disclaimer, the term of this patent is extended or adjusted under 35 U.S.C. 154(b) by 508 days.

(21) Appl. No.: 13/578,923

(22) PCT Filed: Feb. 11, 2011

(86) PCT No.: PCT/FR2011/050289
§ 371 (c)(1),
(2), (4) Date: Aug. 14, 2012

(87) PCT Pub. No.: WO2011/101581
PCT Pub. Date: Aug. 25, 2011

(65) Prior Publication Data
US 2012/0313651 A1    Dec. 13, 2012

(30) Foreign Application Priority Data
Feb. 18, 2010 (FR) ..................... 10 00684

(51) Int. Cl.
*G01R 27/08* (2006.01)
*H01H 9/16* (2006.01)
*F02K 1/76* (2006.01)
(Continued)

(52) U.S. Cl.
CPC ............. *H01H 9/167* (2013.01); *F02K 1/763* (2013.01); *G01R 31/008* (2013.01); *H01H 47/002* (2013.01); *Y02T 50/671* (2013.01)

(58) Field of Classification Search
CPC ....................................... G01R 27/08
USPC ................................... 324/691–722
See application file for complete search history.

(56) References Cited

U.S. PATENT DOCUMENTS 2,976,468 A * 3/1961 Rouse ...................... 318/400.37
3,550,090 A * 12/1970 Baker, Jr. et al. ............. 367/199
4,359,721 A * 11/1982 Galvin et al. ................. 340/525
(Continued)

FOREIGN PATENT DOCUMENTS

CN          1147300 A       4/1997
CN          1426513 A       6/2003
(Continued)

OTHER PUBLICATIONS

DeVisme et al., "Ladder Networks With Elements in Geometric Progression", Proceedings of IEE, vol. 112, Aug. 1965, p. 1533-1534.*
(Continued)

*Primary Examiner* — Patrick Assouad
*Assistant Examiner* — Lamarr Brown
(74) *Attorney, Agent, or Firm* — Oblon, McClelland, Maier & Neustadt, L.L.P.

(57) ABSTRACT

A circuit for detecting individual positions of a plurality of electrical contactors, including a plurality of modules each including a contactor having k separate contact positions each connected in series to a resistor associated with an integer status value between 1 and k and separate from other status values of a same module, each module being associated with a weighting coefficient and the weighting coefficients following a geometric progression of no less than k+1, the electrical conductance value of each resistor being equal to the status value thereof multiplied by the weighting coefficient of the module thereof.

8 Claims, 2 Drawing Sheets

(51) Int. Cl.
  *H01H 47/00* (2006.01)
  *G01R 31/00* (2006.01)

(56) References Cited

U.S. PATENT DOCUMENTS

| | | | | |
|---|---|---|---|---|
| 4,441,100 | A | * | 4/1984 | Galloway ................... 340/518 |
| 4,555,695 | A | * | 11/1985 | Machida et al. ............. 340/538 |
| 4,651,138 | A | * | 3/1987 | Morrison ..................... 340/510 |
| 5,161,158 | A | * | 11/1992 | Chakravarty et al. ............ 714/26 |
| 5,167,119 | A | * | 12/1992 | Ward ............................ 60/226.1 |
| 5,508,626 | A | | 4/1996 | Halin et al. |
| 5,720,449 | A | * | 2/1998 | Laboure et al. ........... 244/110 B |
| 6,151,884 | A | * | 11/2000 | Gonidec et al. .............. 60/226.2 |
| 6,593,758 | B2 | * | 7/2003 | Mulera et al. ................. 324/713 |
| 2003/0025515 | A1 | | 2/2003 | Mulera et al. |

FOREIGN PATENT DOCUMENTS

| | | |
|---|---|---|
| DE | 103 47 979 | 5/2005 |
| EP | 0 638 913 | 2/1995 |
| WO | WO 95/30128 A1 | 11/1995 |

OTHER PUBLICATIONS

International Search Report Issued Apr. 21, 2011 in PCT/FR11/50289 Filed Feb. 11, 2011.

Combined Office Action and Search Report issued Oct. 30, 2014 in Chinese Patent Application No. 201180010178.9 (with English language translation and English translation of categories of cited documents).

* cited by examiner

CIRCUIT FOR DETECTING THE POSITIONS OF CONTACTORS IN A TURBINE ENGINE

BACKGROUND OF THE INVENTION

1. Field of the Invention

The present invention relates to a circuit for detecting individual positions of electrical contacts as well as the application thereof in thrust reverser doors in a turbine engine.

2. Description of the Related Art

The current turbine engines include numerous computers each receiving information coming from sensors such as contactors and interpreting this information so as to determine the actions to be undertaken.

This is, for example, the case of thrust reverser devices commonly used to slow the airplane and assist the braking system so as to reduce the distance necessary for stopping the airplane.

In a known manner, a thrust reverser device includes a plurality of retractable doors that are deployed during braking and closed during other phases of flight. Each door may be equipped with at least three contactors in two states, open or closed, with one contactor being intended to send information on the open position of the door, another contactor being intended to send information on the closed position of the door and the last contactor being intended to provide information on the locking of the door. In addition, for reasons of safety, it is necessary to provide redundancy for each contactor so as to maintain the reliability of information transmitted to the computer.

It is thus understood that, the more the number of contactors is increased, the more the number of inlets and outlets to be interfaced with the computer is increased, producing a greater load for the computer and a large number of connection wires between the computer and the contactors positioned at the thrust reverser doors.

To overcome this problem, the applicant has already proposed, in application EP0638913A1, the production of a circuit comprising contactors with two contact positions arranged in parallel and associated with resistors, so as to reduce the number of inlets and outlets.

However, the solutions proposed have numerous disadvantages. Indeed, in a first case, a defect of a contactor may lead to an incorrect reading of the position of the other contactors. In a second case, it is possible to know the number of open and closed contactors without being capable of specifying their individual position.

BRIEF SUMMARY OF THE INVENTION

The invention is intended in particular to provide a simple, effective and economical solution to at least some of these problems.

To this end, it proposes a circuit for detecting individual positions of a plurality of electrical contactors, characterized in that it includes:
  a plurality of modules connected in parallel or in series and each comprising a contactor with k distinct contact positions each connected in series to a resistor associated with a whole state value of between 1 and k, in which the state values in the same module are in distinct pairs (distinct two by two);
  each module is associated with a weighting coefficient and these weighting coefficients follow a geometric progression of reason greater than or equal to k+1; and in that the electrical conductance (or, respectively, ohmic resistance) value of each resistor is equal to its state value multiplied by the weighting coefficient of its module.

The interfacing of the circuit according to the invention with a computer requires only a reduced number of wires since the information on the individual contact position of a contactor is obtained by measuring the total conductance of the circuit when the modules are in parallel and by the measurement of the total ohmic resistance when the modules are mounted in series. Thus, the number of wires connecting the circuit to a computer is independent of the number of contactors connected in parallel or in series in the circuit.

According to the invention, the determination of the conductance values (or, respectively, resistance values) by multiplication of the state value and the weighting coefficient of the module makes the total conductance (or, respectively, total resistance) value of the circuit unique for a given contact position of each of the contactors. Indeed, the total conductance (or, respectively, total resistance) value obtained corresponds to a decomposition of this value in a base having a value at least equal to k+1, which makes it unique.

The uniqueness of the conductance (or, respectively, ohmic resistance) value thus makes it possible, by a simple measurement of the conductance (or, respectively, ohmic resistance) of the circuit, to determine the individual contact positions of each of the contactors.

When the modules are connected in parallel, and if there is a failure of at least one contactor, the latter will be in the open position. This open position amounts to assigning a state of 0 to the contactor in which it is not involved in the total conductance of the circuit. The measurement of the total conductance of the circuit shows a total conductance value that is different from that obtained if the contactor is in a contact position (i.e. connected to a resistor).

Thus, the parallel connection of the modules has the advantage, with respect to a series connection, of enabling the detection of a failure of one or more contactors and also of knowing precisely which of the contactor(s) is (are) defective. The reliability of the detection circuit is largely improved and the maintenance operations are simplified since it is possible to identify the location of a defective contactor in the circuit. In addition, the failure of one or more contactors does not prevent the individual contact positions of the contactors in a normal state of operation from being determined.

The invention thus makes it possible to reduce the number of inlets necessary on a computer while obtaining the same amount of information. The reduction in the number of wires makes it possible to reduce the mass of the corresponding harnesses, leading to a reduction in costs.

In addition, the design of the circuit in the form of modules enables the subsequent addition of supplementary contactors without having significant modifications of the circuit since the number of wires to the computer remains unchanged.

Advantageously, the modules are connected in parallel and the assembly of modules is connected in series to a supplementary resistor to form a voltage divider bridge, which enables the influence of temperature deviations of each of the resistors to be reduced.

In this configuration, a power supply voltage is applied to the entire circuit and the voltage at the terminals of one of the modules is measured.

The invention also relates to a device for detecting the individual positions of the thrust reverser doors of a turbojet, including a circuit as described above, in which the position of a contactor is associated with the position of a thrust reverser door.

In this case, k may be equal to 2 and each contact position of a contactor is chosen so as to provide information on the degree of opening or closing of a thrust reverser door.

In a particular embodiment of the invention, the device includes at least three contactors per door, of which two contactors are used for determining the degree of closing of the door and another contactor is used to determine the degree of opening of the door.

According to another feature of the invention, the resistors of the modules are mounted in a housing separate from the contactors of the thrust reversers and connected to a computer, making it possible to preserve a wiring diagram identical to that of the prior art between said housing and the contactors arranged at the thrust reversers. In addition, the resistors are subjected to the same temperature since they are mounted in the same housing.

The invention also relates to a turbine engine, such as a turbojet or a turbopropeller of an airplane, characterized in that it includes a detection circuit or a device as described above.

BRIEF DESCRIPTION OF THE SEVERAL VIEWS OF THE DRAWINGS

The invention will be easier to understand, and additional details, advantages and features of the invention will appear in the following description provided by way of a non-limiting example in reference to the appended drawings, in which.

DETAILED DESCRIPTION OF THE INVENTION

Figure 1:
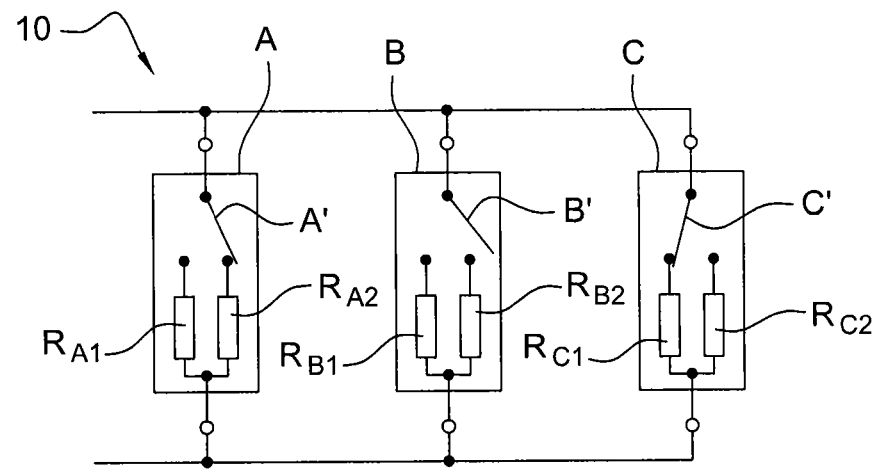
FIG. 1 shows a detection circuit according to the invention in which the modules are mounted in parallel.

Reference is made first to FIG. 1, which shows a detection circuit 10 according to the invention including three modules A, B, C mounted in parallel and each including a contactor A', B', C' capable of establishing two contact positions each connected in series to a resistor. Thus, the contactor A' of module A is connected to two resistors $R_{A1}$, $R_{A2}$ (the index shows the module and the number of the resistor), module B is connected to two resistors $R_{B1}$, $R_{B2}$, and module C is connected to two resistors $R_{C1}$, $R_{C2}$. In each module, each resistor is associated with a state value, different from the state values of the other resistors of the module. These state values are positive and are between 1 and the number of resistors of the module. In the case of FIG. 1, resistors $R_{A1}$, $R_{B1}$, $R_{C1}$ are associated with state 1 and resistors $R_{A2}$, $R_{B2}$, $R_{C2}$ are associated with state 2.

Each module is associated with a weighting coefficient, with these weighting coefficients following a geometric progression of reason 3. Thus, module A is associated with the weighting coefficient $3^0$, module B is associated with the weighting coefficient $3^1$ and module C is associated with the weighting coefficient $3^2$.

The electrical conductance of a resistor is calculated by multiplying its state value by the weighting coefficient of its module.

The table below summarizes the different possible states of each of the contactors of the three modules as well as their electrical conductance values as a function of the weighting coefficient applied to the module.

| | Module A | | | Module B | | | Module C | |
|---|---|---|---|---|---|---|---|---|
| | $R_{A1}$ | $R_{A2}$ | | $R_{B1}$ | $R_{B2}$ | | $R_{C1}$ | $R_{C2}$ |
| State | 0 | 1 | 2 | 0 | 1 | 2 | 0 | 1 | 2 |
| Weighting coefficient | | $3^0$ | | | $3^1$ | | | $3^2$ | |
| Electrical conductance (S) | 0 | 1 | 2 | 0 | 3 | 6 | 0 | 9 | 18 |

It should be noted that this table also includes cases in which the state of a contactor is zero, corresponding to an open circuit, which is the case when the contactor is malfunctioning. In this case, the conductance of such a module is zero.

In the case of the circuit of FIG. 1, it is shown that the contactor of module A is in state 2, the contactor of module B is in state 0 corresponding to the open position and the contactor of module C is in position 1. It is clear that the total conductance of the circuit is equal to 2+0+9, i.e. 11.

This conductance value is unique and corresponds only to the combination of state 2 for contactor 1 of module A, state 0 for module B and state 1 for module C.

Thus, by a simple measurement of the total electrical conductance at the terminals of the circuit, it is possible to deduce the position of the contactors and also know whether a contactor is in the open position and which of the contactors is in this open position corresponding to a malfunction state.

The table below takes into account the uniqueness of the value of the total conductance of the electrical circuit for the different possible combinations of the states of the three modules A, B and C.

| State of the Module A | State of the Module B | State of the Module C | Total electrical conductance (S) |
|---|---|---|---|
| 0 | 0 | 0 | 0 |
| 1 | 0 | 0 | 1 |
| 2 | 0 | 0 | 2 |
| 0 | 1 | 0 | 3 |
| 1 | 1 | 0 | 4 |
| 2 | 1 | 0 | 5 |
| 0 | 2 | 0 | 6 |
| 1 | 2 | 0 | 7 |
| 2 | 2 | 0 | 8 |
| 0 | 0 | 1 | 9 |
| 1 | 0 | 1 | 10 |
| 2 | 0 | 1 | 11 |
| 0 | 1 | 1 | 12 |
| 1 | 1 | 1 | 13 |
| 2 | 1 | 1 | 14 |
| 0 | 2 | 1 | 15 |
| 1 | 2 | 1 | 16 |
| 2 | 2 | 1 | 17 |
| 0 | 0 | 2 | 18 |
| 1 | 0 | 2 | 19 |
| 2 | 0 | 2 | 20 |
| 0 | 1 | 2 | 21 |
| 1 | 1 | 2 | 22 |
| 2 | 1 | 2 | 23 |
| 0 | 2 | 2 | 24 |
| 1 | 2 | 2 | 25 |
| 2 | 2 | 2 | 26 |

Figure 2:
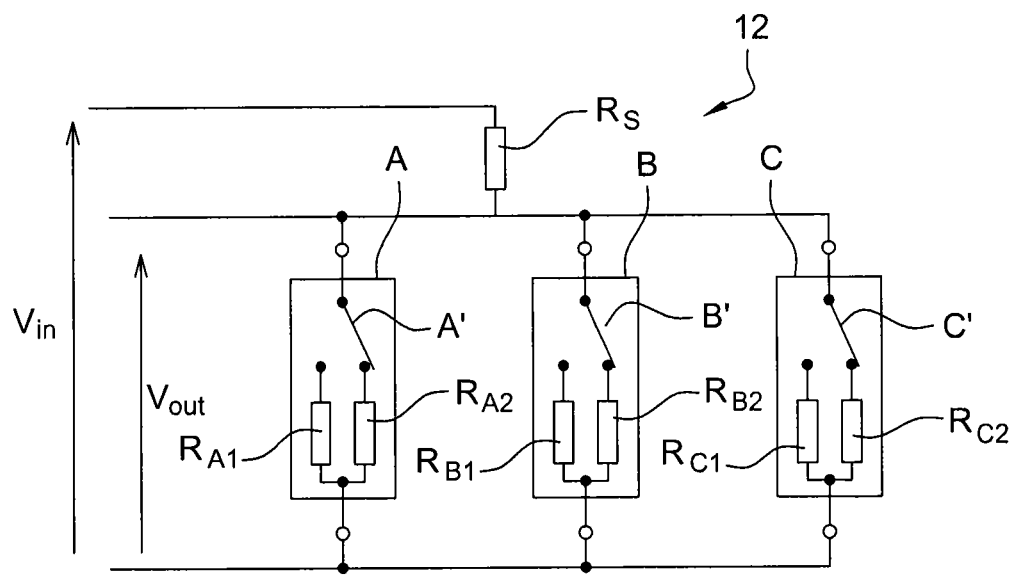
FIG. 2 shows an alternative of the circuit of FIG. 1.

As shown in FIG. 2, all of the modules are connected in parallel with one another and in series with a supplementary resistor $R_s$ and thus form a voltage divider circuit 12, which enables the influence of the temperature on the measurement of the voltage to be reduced.

A power supply voltage $V_{in}$ is applied to the entire circuit. The parameter measured is no longer the conductance at the terminals of the modules but the voltage $V_{out}$ at the terminals of same. However, it is necessary to establish a correspondence table between the voltage read $V_{out}$ and the total conductance of the circuit since the different voltage values are not distributed regularly over a range of whole voltage values as for the conductance values.

Figure 3:
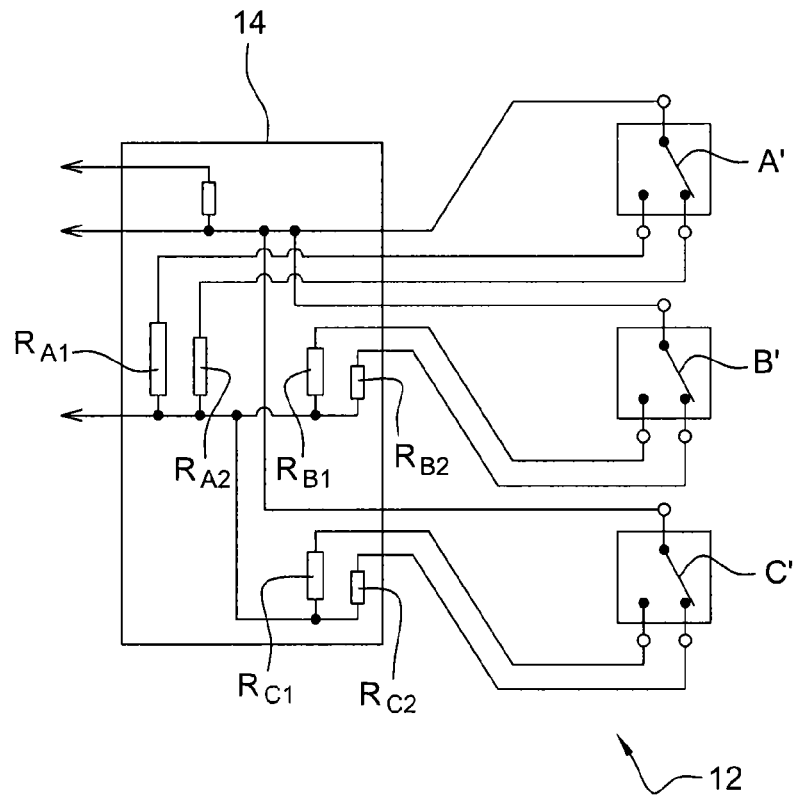
FIG. 3 shows the integration, in a housing, of resistors of a circuit according to the invention.

The above embodiment is particularly beneficial when it is used in a thrust reverser device as used in modern airplanes. In this case, contactors with two contact positions (k=2) are used. The resistors are mounted in a housing 14 separate from the contactors A, B, C, enabling all of the resistors to be subjected to the same temperature and thus the effects of the temperature on the measurement of the voltage to be limited (FIG. 3).

Such a thrust reverser device can include a plurality of doors each associated with a plurality of contactors with two positions. In a particular configuration, each door is associated with at least three contactors of which two are used to determine the degree of closing of the door and a third is used to determine the degree of opening of the door. Each of the first two contactors includes two positions enabling "door completely open" or "door not completely open" information. The third contactor includes two contact positions enabling the "door completely open" or "door not completely open" information to be obtained.

Thus, the combination of this information makes it possible to determine with certainty the open or closed state of a given door of a thrust reverser device.

The device according to the invention can be integrated in all of the current turbine engines with thrust reversers, grids or shutters, for example, since it uses conductors of the prior art between the housing and the thrust reversers and only the number of conductors between the housing and the computer is reduced.

Figure 4:
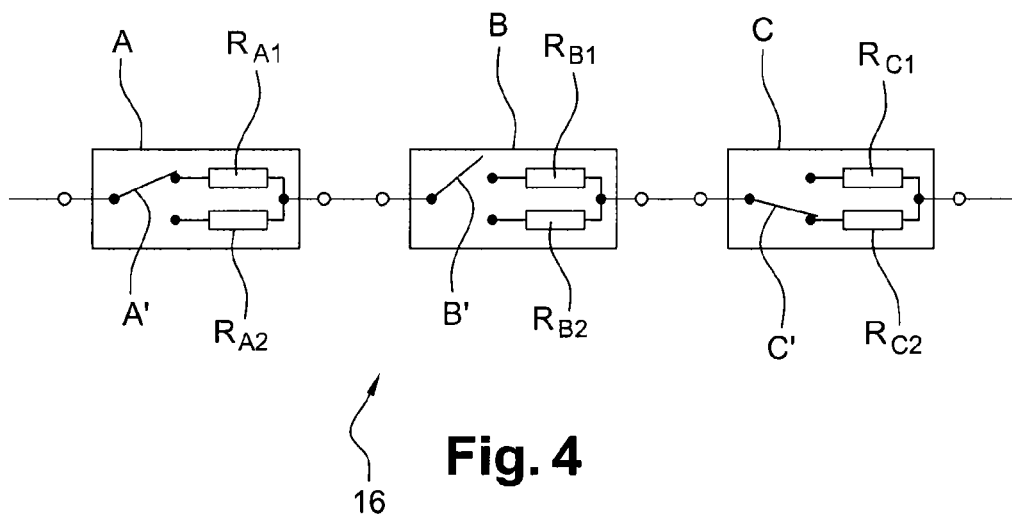
FIG. 4 shows a circuit according to the invention in which the modules are mounted in series.

FIG. 4 shows a circuit 16 according to the invention in which the modules have been arranged in series. The operation of this type of circuit is identical to that of an assembly with the modules in parallel and the reasoning used in reference to FIG. 1 is valid when concerning ohmic resistances since, in series, it is the resistors that are added. However, it is understood that in the case of a series assembly of the modules, once a contactor malfunctions (its state is equal to 0), the impedance of the circuit is infinite and it is not possible to determine which of the contactors is defective or whether a plurality of contactors are defective.

The invention described in reference to the drawings can easily be generalized to N modules each including a contactor capable of establishing k distinct contact positions. It should be noted that the number of contact positions k in each module can be different from one module to another. For example, it is possible for a module to include a contactor with k1 distinct contact positions as well as k1 resistors of which the states are between 1 and k1 and for another module to include a contactor with k2 distinct contact positions as well as k2 resistors of which the states are between 1 and k2, with k2>k1. In this case, the value of each electrical conductance (or, respectively, ohmic resistance) of each of the modules is determined by using a geometric progression of reason greater than or equal to k2+1, so as to ensure the uniqueness of the total electrical conductance (or, respectively, ohmic resistance) of the circuit.

The invention claimed is:

1. A circuit for detecting individual positions of a plurality of electrical contactors, comprising:
    a plurality of modules connected in parallel or in series and each comprising a contactor with k distinct contact positions each connected in series to a resistor associated with a whole state value of between 1 and k, in which the state values in a same module are in distinct pairs;
    each module is associated with a weighting coefficient and these weighting coefficients follow a geometric progression of reason greater than or equal to k+1; and
    wherein the electrical conductance or ohmic resistance value of each respective resistor is equal to its state value multiplied by the weighting coefficient of its module.

2. A circuit according to claim 1, wherein the modules are connected in parallel and an assembly of modules is connected in series to a supplementary resistor to form a voltage divider bridge.

3. A device for detecting individual positions of thrust reverser doors of a turbojet, comprising:
    a circuit according to claim 1, in which a position of a contactor is associated with a position of a thrust reverser door.

4. A device according to claim 3, wherein k is equal to 2, with each contactor having a contact position to provide information on a degree of opening or closing of a thrust reverser door.

5. A device according to claim 4, comprising at least three contactors per door, of which two contactors are used for determining a degree of closing of the door and a third contactor is used to determine a degree of opening of the door.

6. A device according to claim 3, wherein the resistors of the modules are mounted in a housing separate from the contactors of the thrust reversers and connected to a computer.

7. A turbine engine, a turbojet, or a turbopropeller, of an airplane, comprising a detection circuit according to claim 1.

8. A turbine engine, a turbojet, or a turbopropeller, of an airplane, comprising a device according to claim 3.

* * * * *